United States Patent
Kyoh et al.

(10) Patent No.: US 6,635,549 B2
(45) Date of Patent: Oct. 21, 2003

(54) METHOD OF PRODUCING EXPOSURE MASK

(75) Inventors: Suigen Kyoh, Yokohama (JP); Iwao Higashikawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 09/961,488

(22) Filed: Sep. 25, 2001

(65) Prior Publication Data

US 2002/0037625 A1 Mar. 28, 2002

(30) Foreign Application Priority Data

Sep. 27, 2000 (JP) .................................... 2000-294979

(51) Int. Cl.$^7$ ................................................. H01L 21/76
(52) U.S. Cl. ............. 438/401; 438/975; 148/DIG. 102; 257/797; 355/53
(58) Field of Search ................................ 438/401, 975; 148/DIG. 102; 257/797; 355/53, 22, 43

(56) References Cited

U.S. PATENT DOCUMENTS

| | | | | |
|---|---|---|---|---|
| 4,575,250 A | * | 3/1986 | Suzuki ........................ | 356/401 |
| 4,659,228 A | * | 4/1987 | Totsuka et al. ............. | 356/401 |
| 4,780,615 A | * | 10/1988 | Suzuki ........................ | 250/548 |
| 5,005,046 A | * | 4/1991 | Hashimoto .................... | 355/77 |
| 5,160,957 A | * | 11/1992 | Ina et al. ..................... | 355/43 |
| 5,309,197 A | * | 5/1994 | Mori et al. ................... | 355/53 |
| 6,048,650 A | * | 4/2000 | Lin .............................. | 430/5 |
| 6,344,892 B1 | * | 2/2002 | Sugita et al. ................. | 355/53 |
| 2002/0006553 A1 | * | 1/2002 | Kikuchi ........................ | 430/5 |

FOREIGN PATENT DOCUMENTS

| | | | |
|---|---|---|---|
| JP | 05-142746 | | 6/1993 |
| JP | 2002107911 A | * | 4/2003 |

* cited by examiner

*Primary Examiner*—Long Pham
(74) *Attorney, Agent, or Firm*—Finnegan, Henderson, Farabow, Garrett & Dunner, L.L.P.

(57) ABSTRACT

A method of producing an exposure mask by carrying out at least two times of exposure on a mask substrate, wherein at a first time of pattern exposure, alignment marks to be reference for positioning at a second time of exposure are exposed onto a position on the mask substrate with positional error by substrate deformation obtained in advance with an exposure apparatus to be used corrected, and at a second time of pattern exposure, positional error by substrate deformation obtained in advance with the exposure apparatus to be used is corrected and thereby the position of the alignment marks are detected, and on the basis of the detected position of the alignment marks, the positions between exposure patterns are aligned.

14 Claims, 7 Drawing Sheets

| Exposure device A | Mark position coordinate [μm] | | Position displacement [nm] | |
|---|---|---|---|---|
| | X coordinate | Y coordinate | X coordinate | Y coordinate |
| Mark 1 | -70000 | -70000 | -57 | -62 |
| Mark 2 | -70000 | 70000 | -48 | 81 |
| Mark 3 | 70000 | -70000 | 54 | -65 |
| Mark 4 | 70000 | 70000 | 51 | 44 |

FIG. 6

| Exposure device B | Mark position coordinate [μm] | | Position displacement [nm] | |
|---|---|---|---|---|
| | X coordinate | Y coordinate | X coordinate | Y coordinate |
| Mark 1 | -70000 | -70000 | 38 | 16 |
| Mark 2 | -70000 | 70000 | 42 | -13 |
| Mark 3 | 70000 | -70000 | -26 | -25 |
| Mark 4 | 70000 | 70000 | -31 | 29 |

FIG. 7

| Detection error | Mark position coordinate [μm] | | Position displacement [nm] | |
|---|---|---|---|---|
| | X coordinate | Y coordinate | X coordinate | Y coordinate |
| Mark 1 | -70000 | -70000 | -95 | -78 |
| Mark 2 | -70000 | 70000 | -90 | 94 |
| Mark 3 | 70000 | -70000 | 80 | -40 |
| Mark 4 | 70000 | 70000 | 82 | 15 |

FIG. 8

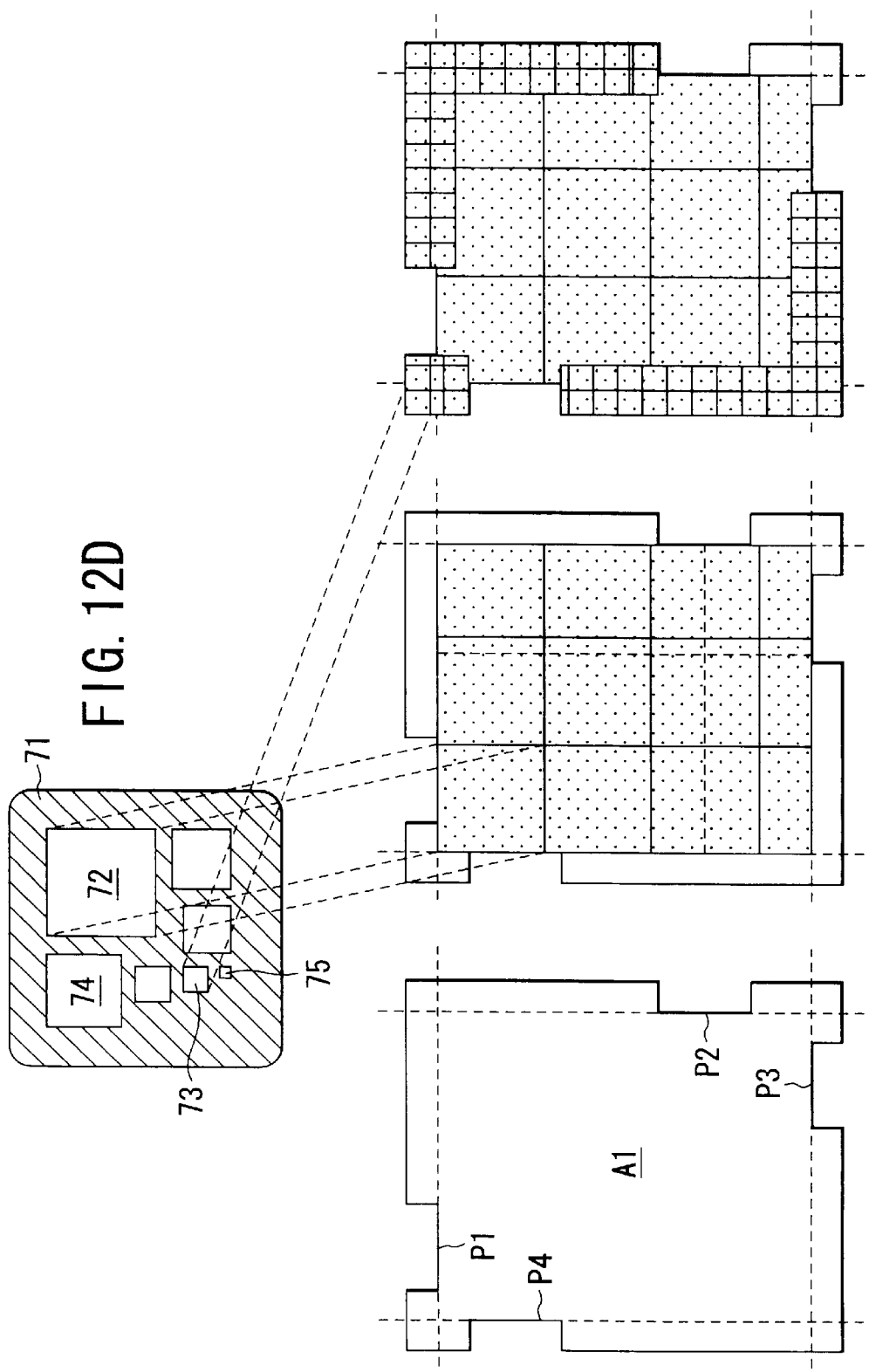

METHOD OF PRODUCING EXPOSURE MASK

CROSS-REFERENCE TO RELATED APPLICATIONS

This application is based upon and claims the benefit of priority from the prior Japanese Patent Application No. 2000-294979, filed Sep. 27, 2000, the entire contents of which are incorporated herein by reference.

BACKGROUND OF THE INVENTION

1. Field of the Invention

The present invention relates to a method of producing an exposure mask to be used in manufacturing a semiconductor device, and more specifically, the invention relates to a method of producing an exposure mask such as a phase shift mask and the like which are produced through at least two processes of exposure.

2. Description of the Related Art

For recent years, much attention has been attracted to a phase shift mask as an exposure mask, where resolution is improved by use of a phase difference of light passing through adjacent patterns. Among this type of phase shift mask, in the course of production of a half tone type exposure mask, a phase shift film, a light blocking film and a resist film are formed on a transparent substrate, and then a first exposure (patterning) is carried out thereon, and a resist pattern is formed by development of the resist film. Then, by selectively etching the light blocking film and the phase shift film by use of this resist pattern, a device pattern (main pattern) is formed on a main pattern area. Next, carried out is a second exposure, namely, a superposition exposure for forming an opening pattern around the device pattern that has been formed by the first exposure. The problem in the process of this superposition exposure is the positional relationship between the main pattern and the opening pattern with which the superposition exposure is carried out onto the main pattern.

Conventionally, in order to set the relative positions of the main pattern and the opening pattern, the following method has been employed. For example, in the case of first exposing and forming a main pattern, when the main pattern is exposed onto a resist film on a main pattern formation area, a plurality of alignment marks are exposed, at the same time, onto a resist film on an area other than the main pattern formation area. At this moment, the main pattern and the alignment mark are formed on the same coordinate system. Then, in the case of carrying out the superposition exposure (second exposure) of the opening pattern onto the main pattern already formed, first the plural alignment marks that have been already formed are detected through the resist film coated on the mask substrate prior to the second exposure. The coordinate system is obtained according to the detected alignment marks, and the opening pattern is exposed according to this coordinate system.

By use of the method, the coordinate system of the main pattern and that of the opening pattern may be the same ideally, and there is no positional error. However, in actual conditions, the position where the alignment marks are formed is displaced from an objective or correct position. This is caused because a vacuum chuck is employed so as to hold a mask substrate in an exposure apparatus, and further, the mask substrate is deformed under influence of gravity. The positional error caused by such deformation appears larger in the outside portion than the center portion of the mask substrate. In ordinary cases, the main pattern is formed at the center portion of the substrate, and alignment marks are arranged on the outside portion thereof. As a consequence, the positional error of alignment marks will be larger than that of the main pattern. Therefore, in carrying out the superposition exposure or the second exposure, a displaced alignment mark is referred to, as a result, it has been extremely difficult to restrict the relative positional error between the main pattern and the opening pattern in superposing exposure to 50 nm or less.

On the other hand, a sequential exposure method is employed for forming the opening pattern in the phase shift mask. The sequential exposure method is performed, for example, by using an exposure machine such as CORE-2564PSM which is a product of ETEC Corporation. In this machine, a spot-shaped laser beam is used to scan a pattern formation area on a mask substrate. A resist film is applied in advance onto the substrate, and the property of a portion of the resist film radiated by the laser beam is changed to be soluble to alkali developing solution. By use of this sequential exposure method mentioned above, and by radiating laser beam onto a portion where resist should be removed, and not doing so onto the portion where resist should be left, it is possible to selectively make the portion where resist is removed and that where resist is left intact.

The biggest problem in exposure an opening pattern by use of the sequential exposure method is that the exposure takes much time. In the case of exposure patterns by scanning a laser beam spot, the period of the pattern drawing time is in proportion with a magnitude of an area to be exposed. The opening pattern has a large area, and the exposure time will be long. For this reason, the throughput in producing phase shift masks will be deteriorated inevitably. And further, an exposure apparatus employing a sequential exposure method in general appears with expensive prices, and when this type of apparatus is occupied for long hours for exposure an opening pattern, the manufacture costs of phase shift masks will be increased.

As mentioned above, in the prior art, production of half tone type phase shift masks has required two times of exposure process, and in exposure for opening patterns by a second superposition exposure, it has been important to precisely set the position of the main pattern formed by a first exposure and the position of the opening pattern to be superposed thereonto. In the conventional method, however, positional error of alignment marks is large, therefore it has been very difficult to make small the positional error at superposition exposure, which has been a problem with the prior art. And further, the sequential exposure method has been employed for exposing an opening pattern necessary for manufacturing a phase shift mask, but the sequential exposure method requires long exposure time, thereby leading to deterioration of the throughput.

BRIEF SUMMARY OF THE INVENTION

According to an aspect of the present invention, there is provided a method of producing an exposure mask by carrying out patterning with at least two times of exposure on a mask substrate, comprising: performing a first time exposure of a first pattern and an alignment mark which is used as a reference for positioning at a second time exposure of a second pattern, the alignment mark being exposed onto a corrected position on the mask substrate with positional error by substrate deformation obtained in advance with a first exposure apparatus to be used corrected, and performing a second time exposure of the second pattern, by detecting a position of the alignment mark with a positional error caused by a substrate deformation obtained in advance in a second exposure apparatus to be used corrected, so as to position the second pattern with respect to the first pattern according to the detected position of the alignment mark.

BRIEF DESCRIPTION OF THE DRAWINGS

FIG. 6 is a table for explaining displacement of exposed alignment marks in a first exposure apparatus.

FIG. 7 is a table for explaining displacement of exposed alignment marks in a second exposure apparatus.

FIG. 8 is a table for explaining a case where exposure displacements in the first and second exposure apparatuses are integrated.

FIGS. 12A through 12D are diagrams showing a process for exposing an opening pattern with combination of plural basic patterns.

DETAILED DESCRIPTION OF THE INVENTION

Figure 1:
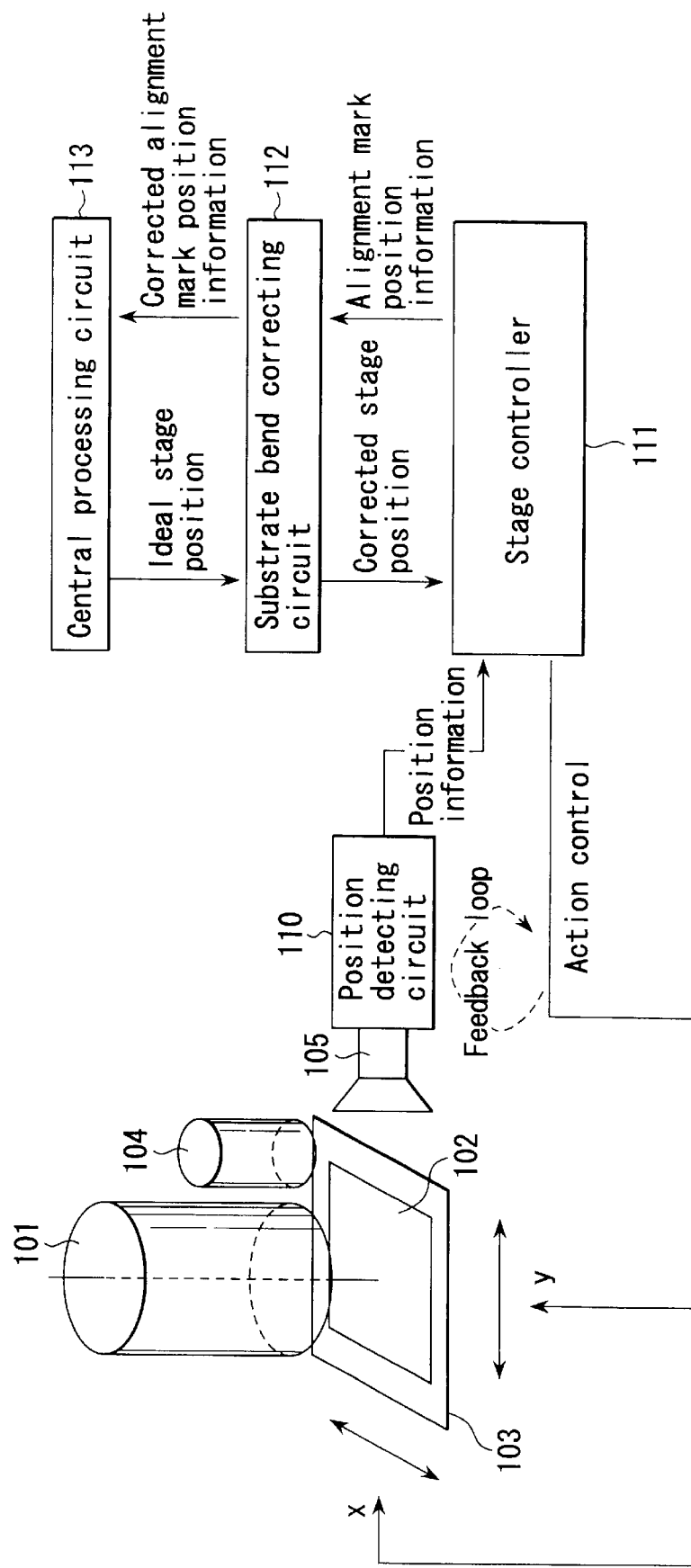
FIG. 1 is a block diagram showing a system of an exposure apparatus to be employed in one embodiment according to the present invention.

The embodiments of the present invention will be explained in more detail by referring to the drawings.

First, with reference to FIG. 1, the structure of an entire system of an exposure apparatus will be explained.

In FIG. 1, an exposure apparatus main body contains a pattern exposure system 101 including a radiation system that radiates a light beam or an electron beam for exposing mask patterns, a stage 103 for holding a mask substrate 102 that receives the exposing beam from the pattern exposure system 101, a mark position detecting system 104 for optically detecting alignment marks formed on the mask substrate 102 for determining the position of the mask substrate 102 on the stage 103, and a position detector 105 for detecting the position of the stage when it moves in x direction and y direction and the position of the alignment marks. The mask substrate 102 is held on the stage 103 by means of a vacuum chuck (not shown).

On the other hand, a control system that controls the exposure apparatus main body comprises a position detecting circuit 110 that outputs position information on the basis of position detection signals from the position detector 105, a stage controller 111 which receives the position information from the position detecting circuit 110 and thereby controls the stage 103 in the x and y directions, a substrate bend correcting circuit 112 which corrects an alignment mark position error caused by the bend of the substrate 102 on the basis of alignment mark position information in the detected position information which will be explained in detail later, and a central processing circuit 113 which outputs stage ideal position information in accordance with the corrected alignment mark position information supplied from the substrate bend correcting circuit 112.

A stage position control operation in the exposure apparatus shown in FIG. 1 is carried out as described below.

When the central processing circuit 113 outputs the ideal stage position information, this information is supplied to the substrate bend correcting circuit 112. The ideal stage position information supplied to the substrate bend correcting circuit 112 is modified or corrected in accordance with the substrate bend amount data obtained in advance under a condition where the mask substrate 102 is fixed onto the stage 103 of this exposure apparatus by means of the vacuum chuck so as to move the stage 103 to a target position. The mark position displacement amount data caused by the substrate bend amount is measured and the measured data is stored in a memory table included in the correcting circuit 112 as shown in FIG. 6, for example. The substrate bend correcting circuit 112 outputs the corrected stage position information to the stage controller 111.

The stage controller 111 compares this corrected stage position information with the position information of the stage 103 obtained from the position detecting circuit 110. When there is a difference between them, the stage controller 111 outputs an operation control signal to control the position of the stage 103 in the direction where such a difference becomes zero. In this way, the stage 103, the position detecting circuit 110 and the stage controller 111 form feedback-loop.

In this manner, the position of the stage 103 is corrected with respect to the displacement amount of the alignment position according to the bend amount of the mask substrate 102, and thereby an ideal stage position can be detected. The explanation thereof will be made in more detail later.

Hereafter, an example of producing processes of a half tone type phase shift mask will be explained with reference to FIGS. 2A to 2E and FIGS. 3A to 3E.

Figure 2A:
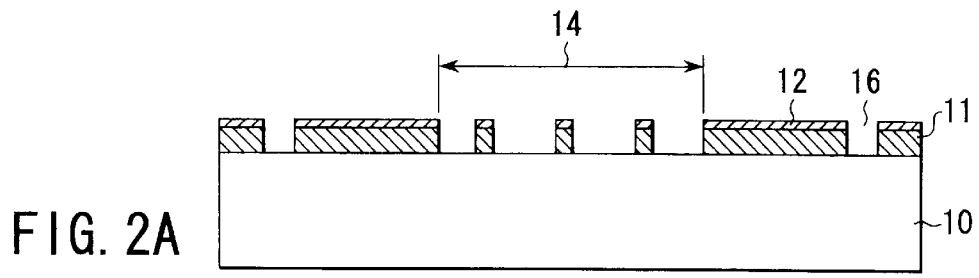
FIGS. 2A through 2E are cross sectional views sequentially showing a producing process of a half tone type phase shift mask.

In the illustrations in FIGS. 2A to 2E, first as shown in FIG. 2A, a half tone phase shift film 11 and a light blocking film 12 are stacked onto a quartz substrate (transparent substrate) 10, and then a device pattern (hereafter referred to also as main pattern) and alignment marks 16 for positioning are formed at the same time.

Specifically, the half tone phase shift film 11 and the light blocking film 12 are stacked onto the quartz substrate 10, and a first resist film (not shown) is applied thereon. After that, by the first time of exposure, the device pattern (main pattern) is drawn onto a resist film corresponding to a main pattern area 14, while alignment marks 16 are drawn around the area 14. In this first time of exposure, an electronic beam exposure apparatus that may form patterns of high precision may be used.

After the exposed resist film is developed to form a resist pattern, the light blocking film 12 and the phase shift film 11 are selectively etched with this resist pattern as a mask, thereby a structure shown in FIG. 2A is obtained.

Herein, a Cr thin film is employed as the light blocking film 12, while a molybdenum silicide film is used as the phase shift film 11. The phase shift film 11 shows semipermeable to an exposure light, and the intensity of the exposure light after passing through the phase shift film 11 declines to 6%, and the phase thereof is delayed by 180 degrees.

Figure 2B:
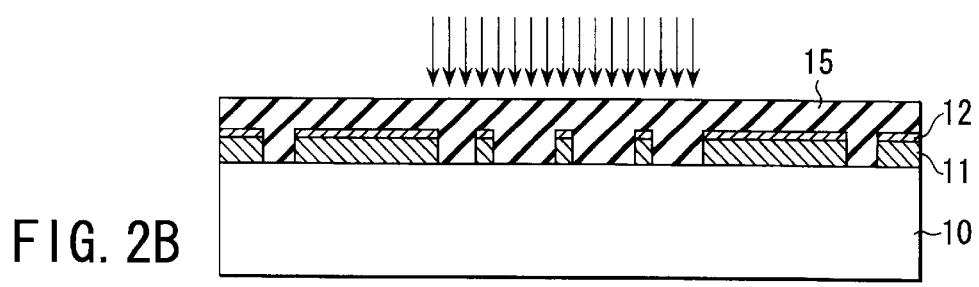

Next, as shown in FIG. 2B, resist (photosensitive resin) 15, for example, TOK-ip3600 manufactured by Tokyo Applied Chemical Co., is applied onto the whole surface of the substrate 102, and an opening pattern for exposing the main pattern area 14 is drawn. In this second time of exposure, a laser exposure apparatus is used, since high speed exposure is required.

Figure 2C:
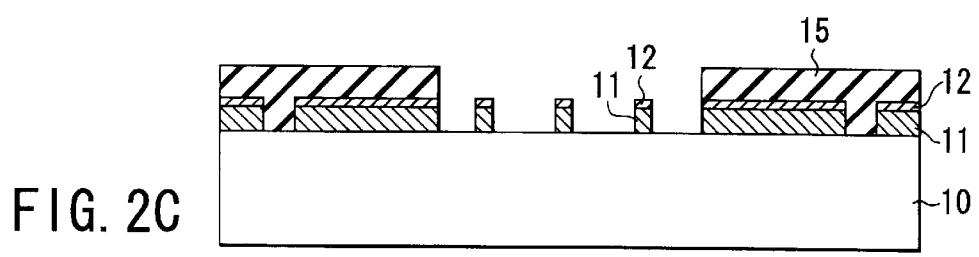
Figure 2D:
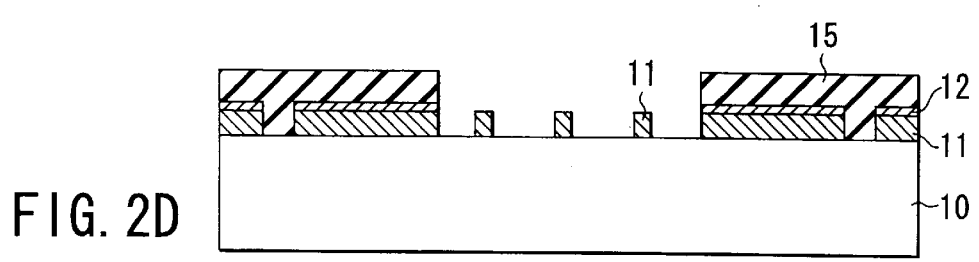
Figure 2E:
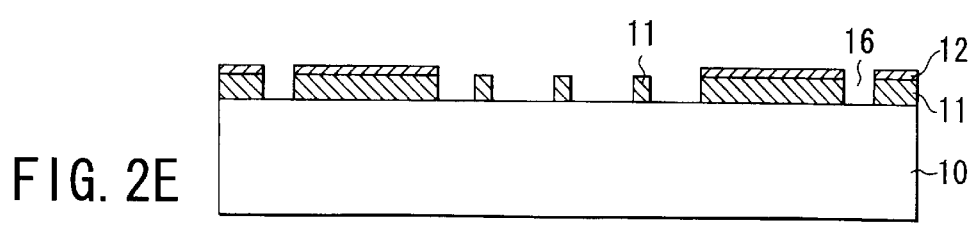

Then, by developing the exposed resist 15, the resist 15 applied to the main pattern area 14 is removed as shown in FIG. 2C. Thereafter, as shown in FIG. 2D, the light blocking film 12 of the main pattern area 14 is removed by etching process. Then, as shown in FIG. 2E, the resist 15 is removed, and the phase shift mask producing process is completed. The phase shift mask thus manufactured may be used in a semiconductor manufacturing process for transferring the main pattern to a semiconductor wafer, for example.

On the other hand, in an example in FIGS. 3A to 3E, a phase shift mask having a structure different from that shown in FIGS. 2A to 2E is produced. Differences from the example in FIGS. 2A to 2E are that the light blocking film 12 is first formed on the substrate 10 and then the phase shift film 11 is formed on the light blocking film 12. Therefore, the opening pattern for the main pattern area 14 is first drawn, and then the device pattern is drawn in the main pattern area 14.

Figure 3A:
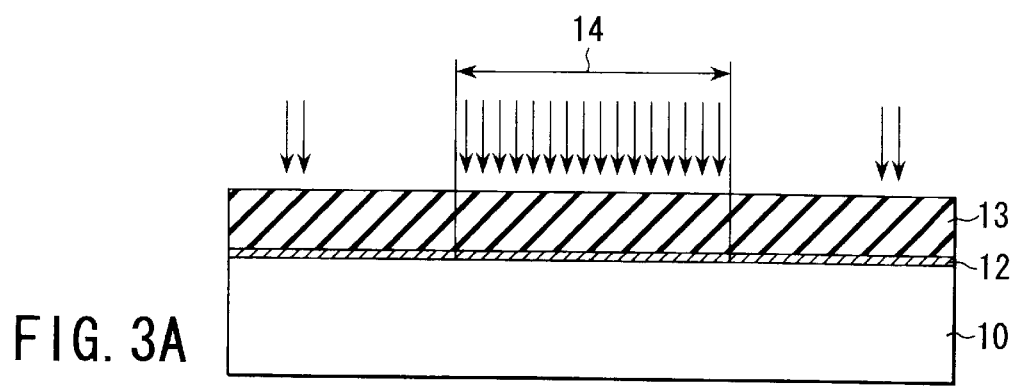
FIGS. 3A through 3E are cross sectional views sequentially showing another producing process of a half tone type phase shift mask.
Figure 3B:
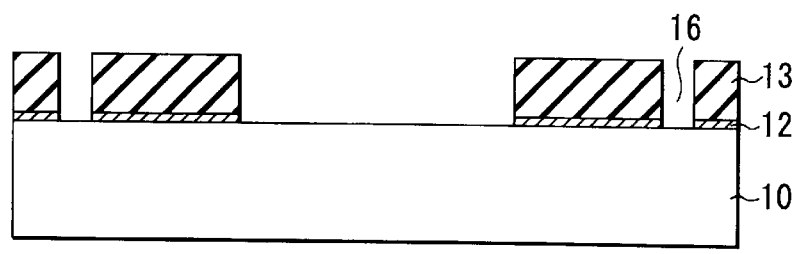

Specifically, as shown in FIG. 3A, a light blocking film 12 is formed onto a quartz substrate 10, and a first resist film 13 is applied thereon. After that, by the first time of exposure, an opening pattern for opening a main pattern area 14 and alignment marks 16 are drawn. And then, as shown in FIG. 3B, the resist film 13 is developed and thereby a resist pattern is formed. Using this resist pattern as a mask, the light blocking film 12 is selectively etched.

Figure 3C:
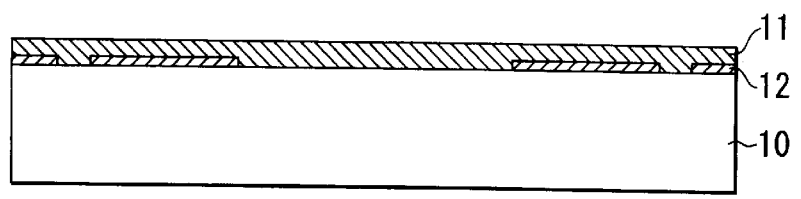

After that, as shown in FIG. 3C, the patterned resist film 13 is removed, and a phase shift film 11 is stacked on the whole surface of the substrate 10.

Figure 3D:
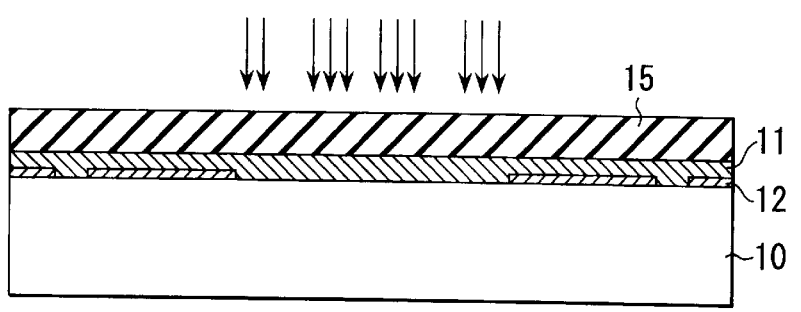
Figure 3E:
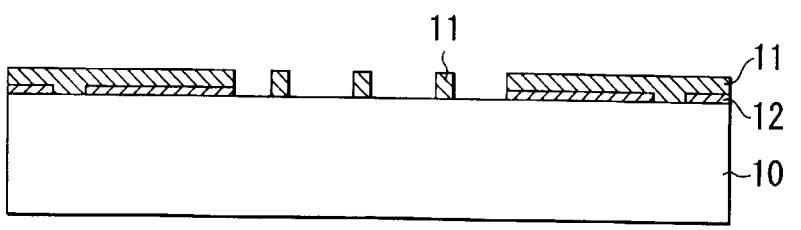

Next, as shown in FIG. 3D, a second resist film 15 is applied onto the phase shift film 11, and then by the second time of exposure, a device pattern (main pattern) is exposed onto the second resist film 15 corresponding to main pattern area 14. Then, as shown in FIG. 3E, the resist film 15 is developed to form a resist pattern. After this process, the phase shift film 11 is selectively etched using the resist pattern as a mask, and thereafter, the resist film 15 is removed. Thus, the phase shift mask producing process is completed.

The reason for the main pattern area 14 where a device pattern is configured by only the phase shift film 11 which is different from the portion covered with the light blocking film 12 prepared by using such a complicated process in phase shift mask will be described below.

The exposure apparatus is equipped with a blind mechanism so as to limit an exposure area when transferring a pattern onto a substrate such as a wafer by use of a phase shift mask. A blind is placed between a mask and an exposure beam source, and by adjusting the blind position, exposure beam is only carried to a target place.

However, since the blind is not always at a position conjugate to the mask, an image of this blind will become blur and a slight amount of the exposure beam will leak on a wafer. In order to produce many device patterns in a single wafer, respective exposure shots are made so that they are adjacent to each other or part of them are overlapped. In such an exposure, beam leaking out from the blind will cause bad influence upon an exposed pattern.

Therefore, for preventing a leaked exposure beam from reaching at a wafer, a light blocking film that completely blocks the leaked exposure beam is necessary also on phase shift mask. While, in the main pattern area 14, the exposure beam must not be blocked because of the semipermeability of the phase shift film 11 to form a delayed pattern beam.

Accordingly, it is necessary to draw the opening pattern for the device pattern area 14, in order to remove a light blocking film mostly corresponding to the main pattern area 14.

The precision required for the opening pattern is described hereafter. The purpose for forming an opening pattern includes two points as mentioned above. Namely, the first point is to remove a light blocking film in a main pattern area 14 so that the effects of the phase shift mask can be fully realized, and to completely block the leaked exposure beam at the border of the adjacent exposure shots. The precision required for an opening pattern is specified by the relative positional relationship with the main pattern area 14, and it is required that the positional error between the main pattern and the opening pattern is 50 nm or less.

Next, a method of increasing a relative positional precision of patterns to be drawn is described hereinafter, in a method of producing a phase shift mask where exposure is carried out at least two times on a single substrate, as an embodiment of the present invention.

Figures 4A, 4B:
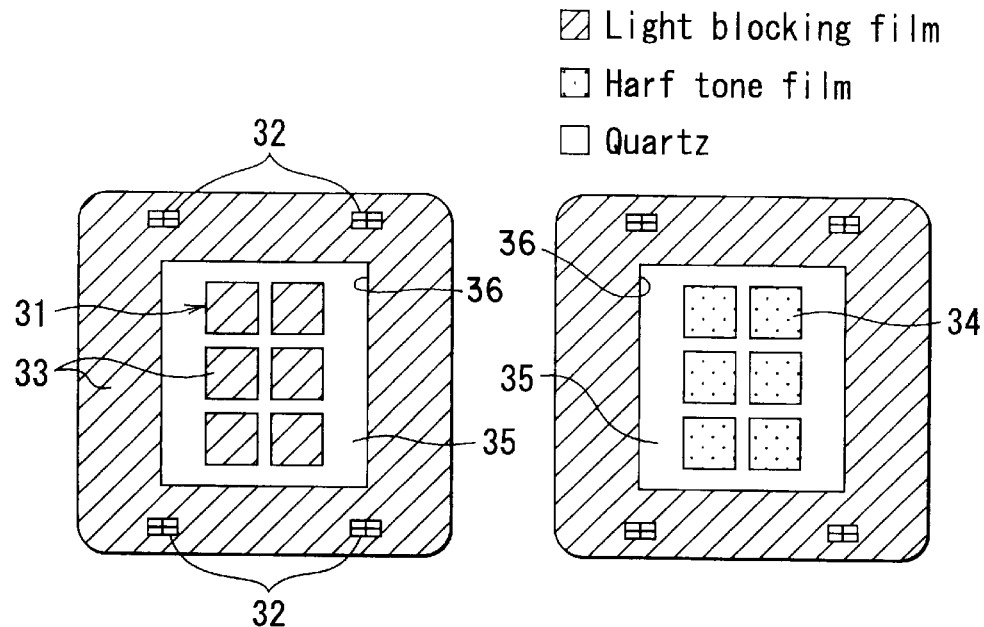
FIGS. 4A and 4B are plan views showing conditions of a half tone type phase shift mask after a main pattern is formed and after an opening pattern is formed, respectively.

FIGS. 4A and 4B show procedures for superposition exposure for manufacturing a phase shift mask. First, alignment marks 32 and the main pattern 31 are drawn on the quartz substrate 35 at the same time. These alignment marks 32 are drawn outside of the area of the main pattern 31. FIG. 4A shows a plan view showing a condition where portions of the beam blocking film 33 and phase shift film 34 are selectively removed after a main pattern 31 is formed. This condition corresponds to that of the case of FIG. 2A. For the sake of the simplicity, the resist film shown in FIGS. 2A–2E is omitted in the case of FIGS. 4A and 4B.

In this case of a half tone type phase shift mask, an opening pattern 36 is then drawn in a superposed manner with the main pattern 31. When the opening pattern 36 is to be drawn, the alignment marks 32 drawn in advance in the previous stage of opening pattern exposure are detected to align the position of the main pattern 31 and that of the opening pattern 36, and the pattern of the detected alignment marks 32 are read. From the read mark position, a coordinate system when the main pattern 31 was drawn is calculated by the central processing circuit 113 shown in FIG. 1, for example, and the opening pattern 36 is drawn in accordance with this coordinate system.

FIG. 4B is a plan view showing a condition where the exposed light blocking film 33 is removed after formation of the opening pattern 36, which corresponds to the case of FIG. 2E.

As mentioned in the description of the prior art, the position of alignment marks 31 are displaced from its objective correct position because the substrate 35 is subject to various external forces at the exposure process. For example, in the exposure machine, CORE-2564PSM, manufactured by ETEC, a vacuum chuck is employed to hold the substrate 35 at exposure. Further, the substrate 35 is kept horizontally, therefore it is subject to gravity too. In this way, the substrate 35 is subject to various external forces, which will cause deflection deformation on the substrate 35. In such a thick substrate as a photo-mask substrate whose thickness is as much as 6.3 mm, its surface expands or shrinks owing to its deflection deformation. When a substrate experiences a convex deformation, its upper surface expands, while its lower surface shrinks. On the contrary, in the case of a concave deformation, its upper surface shrinks, while its lower surface expands.

Figure 5:
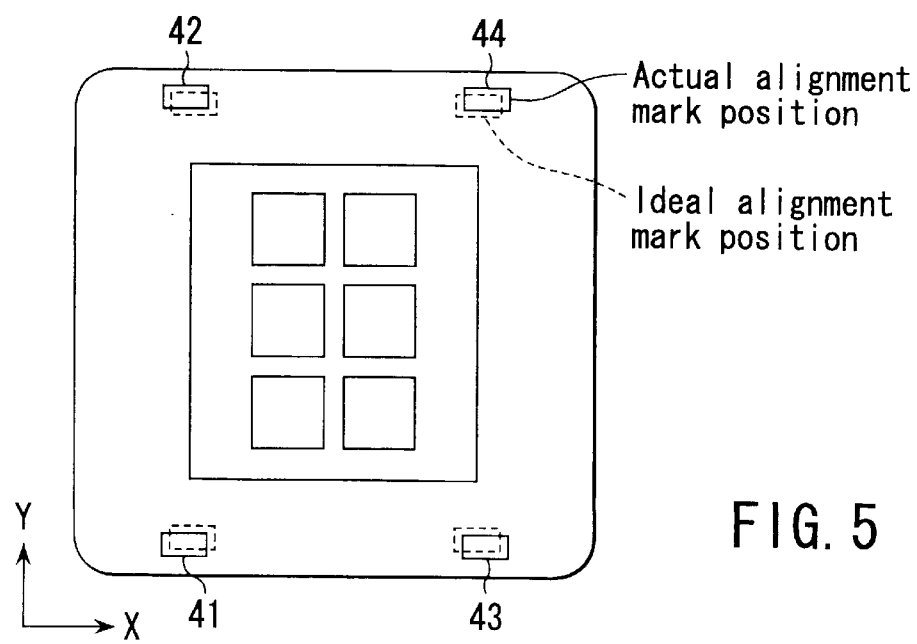
FIG. 5 is a plan view showing displacement of alignment mark position in the case of exposure where the position of the alignment marks is not corrected.

The position of alignment marks that is caused at the exposure of a main pattern and alignment marks by use of a first exposure apparatus A wherein a substrate kept at an exposure position deforms in a concave shape is displaced from its ideal position as shown in FIG. 5. The numeric values of the displacement are shown in FIG. 6. In the case of a concave deformation, the surface to be drawn shrinks at exposure, and when it is returned to a flat condition, the shrunk surface seems to be expanded. Therefore, drawn alignment marks must be outside of a regular position. By the way, marks 41 to 44 in FIG. 5 correspond to marks 1 to 4 in FIG. 6.

On the other hand, when a second exposure apparatus B is set to support a substrate by 3 points, downward bend caused by gravity occurs at points not supported by the supporting mechanism and an upward stress or reaction force caused by the supporting mechanism will occur at the supporting points. In this case, the deflection deformation of a substrate shows complicated shapes. For example, a concave deformation occurs in the X direction of the substrate, and concave deformation in some portions and convex deformation in other portions appear in the Y direction. The displacement amount to a regular position in alignment marks drawn by the exposure apparatus B is as shown in FIG. 7.

FIGS. 6 and 7 show, how much the mark position will be displaced from its ideal position when alignment marks are drawn by the exposure apparatus A and the exposure apparatus B.

Now, the case of superposition exposure according to the embodiment of the present invention will be described. In concrete, a main pattern and alignment marks are drawn onto a substrate by the exposure apparatus A, and superposition exposure is made by the exposure apparatus B. The positional error shown in FIG. 5 is included in the position of alignment marks drawn on a substrate by the exposure apparatus A. When this substrate is then placed onto the exposure apparatus B, the substrate is deformed in a different manner from the case of the exposure apparatus A, and the position of alignment marks is further displaced according to this deformation. The positional error of alignment marks is subject to the influence of errors of both the exposure apparatuses A and B. At the mark position detected by the exposure apparatus B, the positional error as shown by the following equation is mixed. Error amounts detected for respective marks are shown in FIG. 8.

Error caused at detection=(error in the exposure apparatus A)−(error in the exposure apparatus B)

As mentioned above, when different exposure apparatuses are employed in superposition exposure, a large system error is included in the position of alignment marks. In the present embodiment, there is provided a method where the position of a main pattern and that of an opening pattern are not relatively displaced even exposure is made by plural exposure apparatuses.

The problems in superposition exposure by using the exposure apparatuses A and B are summarized into the following 2 points. The first point is that marks are drawn on a position displaced from an ideal position at exposure of alignment marks. It is mentioned above that this displacement is caused by deformation on a substrate by external forces when the substrate is held in an exposure apparatus. And the second point is that detection is made without consideration of displacement owing to deformation at detection of alignment marks. As a consequence, even when alignment marks are at a proper position on a substrate, it is impossible to restrict the relative positional error between the main pattern and the opening pattern because of the second reason.

In order to make this positional error zero in principle manner, the present embodiment employs the following method. First, the positional error peculiar to each exposure apparatus is forecasted in advance, and thereby alignment marks are drawn onto such a position as to set off the positional error at exposure alignment marks. For example, as shown in FIG. 6, when a pattern is drawn as it is on the position of a mark 1 by the exposure apparatus A, the X coordinate is displaced −57 nm from the regular position, while the Y coordinate is displaced −62 nm. In order to set off them, at exposure marks, the mark 1 is drawn on the position displaced +57 nm in the X coordinate, and +62 nm in the Y coordinate. And a mark 2 is also drawn in a position which is represented by the positional errors occurring at exposure with opposite direction or polarity in the same manners.

The mark position of a substrate on which such exposure as mentioned above is carried out is to be at the regular position without deformation on a substrate by external forces. In order to carry out the exposure with position corrected as described above, it is necessary that an exposure apparatus is equipped with a position correction function. As shown in FIG. 7, for example, a correction amount varies with mark positions, an exposure apparatus should use functions for calculations of correction amounts or have a correction table. Equations for correcting positional error owing to gravity deflection caused by 3-point supporting will be shown below:

$$X=f(x, y)$$

$$Y=g(x, y)$$

wherein, the upper case characters X and Y represent the position of exposure after correction, and these are calculated from an ideal position x, y. Both X and Y are biquadratic functions including cross terms of x, y. By use of these correction equations, it is possible to restrict positional errors to 5 nm or less, and it is possible to set the exposure position of alignment marks without influence of substrate deflection deformation.

Next, a method of compensating an error to occur at detection of alignment marks in the previous stage of superposition exposure will be described. Even when a substrate is free of external deformation forces and alignment marks are at their regular position, when this substrate is mounted on an exposure apparatus for superposition exposure, the substrate will show deformation under external force caused by supporting it. In the previous example, marks at the regular positions x, y are detected at the positions X, Y. Since there is an error of several ten nm between x and X, and that between y and Y, these become the factor of error. In order to avoid this, a reference position to read marks is made not x but X or not y but Y. That is, it is detected how much alignment marks are displaced from the position x or y in conventional art, while in the present embodiment, displacement from the position X or Y is judged.

In this manner, even when the position of alignment marks is displaced by substrate deflection deformation, it is possible to detect alignment marks in a corrected status where a substrate is free of external forces. By detecting alignment marks by use of a substrate whose alignment marks are at the regular position in a status free of external force, it is possible to detect alignment marks in a manner when they are at their regular position. In this position detection algorithm too, just like in correction at exposure, an exposure apparatus provided with a substrate bend amount correction mechanism capable of converting the regular position and the position after a substrate is held may be used.

As mentioned above, in the present embodiment, when alignment marks are drawn, position errors caused by the deflection or bend deformation are corrected, and corrected alignment marks are detected at superposition exposure, thereby enabling to enhance the positioning precision of a main pattern and an opening pattern. Further, by providing a position correction function to an exposure apparatus, numeric values to be handled in the exposure apparatus are only those of the regular position, accordingly there is no need for complicated conversion equation or conversion table. Still further, since the position of alignment marks is at the regular position in a status where a substrate is free from external force, by applying the present embodiment in superposition exposure, the superposition exposure can be performed in any exposure apparatus. In other words, it is possible to draw a main pattern and an opening pattern by using any types of exposure apparatuses.

As mentioned in detail above, according to the present embodiment, when exposing alignment marks at the first time of exposure, exposure is carried out onto a position where positional error caused by substrate deformation (especially deflection deformation) is corrected, and at the second time of exposure, the positions of the alignment marks in which positional error of substrate deformation is corrected are detected. Therefore, it is possible to eliminate displaced superposition exposure caused by the mark position error, and it is possible to increase the relative positional precision of superposition exposure. Thereby, it is possible to carry out pattern positioning at the first exposure and the second exposure in precise manners, and it is possible to produce a phase shift mask and the like at high precision. In the experiments conducted by the present inventors, it has been proved to be possible to restrict the relative positional error between a pattern formed by the first time of exposure and that formed by the second time of exposure to 50 nm or less.

In a modification of the present embodiment mentioned hereafter, a method of exposure an opening pattern in a half tone type phase shift mask with low costs and in shorter time will be provided.

The fundamental producing process of phase shift masks is the same as the case shown in the previous FIGS. 2A to 2E and FIGS. 3A to 3E. A resist is applied to a substrate where a main pattern and alignment marks as shown in FIG. 2A are formed, as shown in FIG. 2B, and then an opening pattern is exposed. Here, the opening pattern comprises a rectangular or a combination of plural rectangulars, as shown in plan views of FIGS. 9A and 9B or FIGS. 10A and 10B.

Figure 9A:
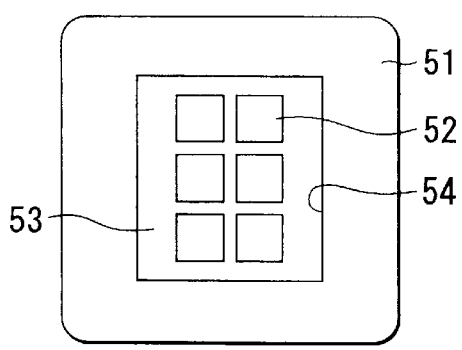
FIGS. 9A and 9B are plan views showing a concrete example of an opening pattern in a half tone type phase shift mask.
Figure 9B:
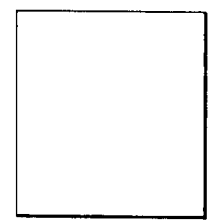
Figure 10A:
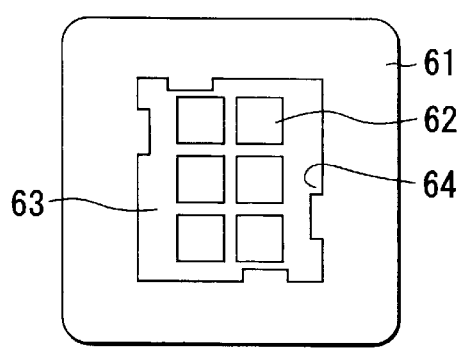
FIGS. 10A and 10B are plan views showing another concrete example of an opening pattern in a half tone type phase shift mask.
Figure 10B:
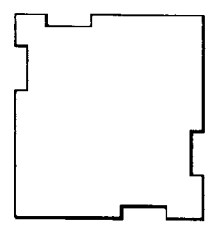

In FIGS. 9A, 9B and FIGS. 10A and 10B, FIG. 9A and FIG. 10A show plan views of phase shift masks finally obtained respectively, while FIG. 9B and FIG. 10B show areas to be drawn for opening patterns respectively. Further, the present modified embodiment may be also applied to exposure of an opening pattern of a phase shift mask having such structure as shown in FIGS. 3A to 3E.

The precision required for an opening pattern is specified by the relative positional relationship with a main pattern area, and it is required that the positional error between a main pattern and an opening pattern is 50 nm or less. In order to attain this position precision, a method described in the present modified embodiment is effective.

Next, a method of exposure an opening pattern that is the object of the present embodiment in shorter time than the conventional sequential exposure methods will be described. For the exposure of an opening pattern, a device that can transfer a pattern in an original plate of a specific width onto a substrate in batch manner, i.e., what is generally called a stepper (an i-ray stepper in the present embodiment) is used.

Figure 11:
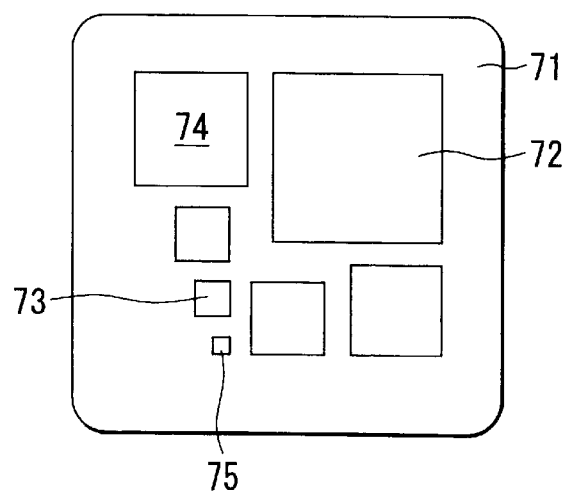
FIG. 11 is a plan view showing an example of an original plate where plural basic patterns with different dimensions are arranged.

First, as shown in FIG. 11, there are prepared an original plate having basic shapes of regular squares of various sizes (transparent portions) 72 to 75 and the like in part of a light blocking portion 71. In the present embodiment, prepared are 7 kinds of regular squares whose square sizes are 15 mm at maximum, and 0.01 mm at minimum on a substrate to be pattern transferred. As for the opening pattern to be drawn, the opening pattern in the previous FIG. 9B is used as an example.

In the first place, as shown in FIG. 12A, the most inside straight lines P1 to P4 of a pattern are extended, thereby, a simple rectangular area Al is formed inside the opening pattern. And as shown in FIG. 12B, by use of the basic shape 72 that is the largest regular square that goes into the rectangular in the original plate shown in FIG. 12D (same as FIG. 11), exposure is carried out without clearance and that not going out of the rectangular Al.

At this moment, as shown in the figure, the length of one side of the rectangular Al is not always multiple times of an positive number of the exposure area in the basic shape 72 of regular square, there are partially duplicated portions in the area of the regular square 72, but there is no problem. The exposure amount of a portion to which duplicated exposure is performed becomes twice or more according to the times of duplication, but as for an opening pattern, it is all right when resist of the portions are to be removed, therefore, there is no problem even when the exposure amount becomes twice or more. On the contrary, allowing patterns to be overlapped enables to use a large regular square, which in turn enables to shorten time required for exposure.

After the rectangular Al having a large area is all exposed by the regular square 72, the remaining opening pattern portions, i.e., as shown in FIG. 12C, the portions enclosed by the extended lines of the straight lines P1 to P4 and that opening pattern external lines are exposed with a further smaller basic shape pattern, for example, the regular square 73 in FIG. 12D. At this moment too, the two conditions may be satisfied, i.e., that the regular square 73 to be exposed does not go out of the most outside circumference of the opening pattern, and that any portion of the remaining opening pattern portion is exposed at least once.

By carrying out exposure on an opening pattern by combination of various sizes of regular squares in the manners mentioned above, it is possible to expose a complicated opening pattern by combination of 100 regular squares or less. A time period of exposure by using one regular square can be made within about 1 second, therefore, exposure on an opening pattern by this method is made within about several minutes. The time required to expose an opening pattern is far shorter than that required for sequential exposure by a laser exposure apparatus which takes several hours.

In the present modified embodiment, since the opening pattern to be realized is made up with combination of only rectangulars, the patterns prepared for the original plate are only regular squares as shown in FIG. 11. Further, in order to realize an opening pattern having an angle other than 90 degrees, by preparation of trapezoids and the like having the same angle, it is also possible to expose an opening pattern having a variety of shapes. Further, in the present embodiment, the exposure method thereof has been described with an example wherein the inside of an opening pattern fully becomes an exposure area. However, it is obvious that pattern exposure is available also on, for example, an opening pattern wherein there are portions not to be exposed at the central portion thereof, for example, by use of the present embodiment.

Hereinafter, a modified example of the foregoing embodiment is further developed, and a method of preventing faults from coming in at the exposure of an opening pattern is described.

When exposing an opening pattern with combination of basic shapes prepared on an original plate, there may be dust attached onto basic shapes formed of a transparent portion. When there is dust on basic shapes, dust blocks a part of the exposure beam during exposure process, as a result, a shadow is formed on a portion to be exposed on a substrate, and this shadow portion becomes a fault. Accordingly, in a modified example of the present embodiment, the following two exposure methods have been developed so that there is no fault at exposure an opening pattern.

In a first exposure method thereof, in the opening pattern exposure process, as for a first time of exposure, an opening pattern is drawn in the completely same manner as the method explained by referring to FIGS. 12A to 12D. Thereafter, a second exposure is carried out on the same substrate by making a pattern area division different from that shown in FIGS. 12A to 12C. In the second exposure, for example in FIG. 12B, when exposure of the rectangular area Al at the center of the pattern, not the largest regular square but the second largest regular square, for example, a rectangular 74 in FIG. 12D, is employed. And with respect to the outside portion of the area Al too, not a regular square 73 employed in exposure explained in FIG. 12C but one-size smaller regular square, for example, a regular square 75 is employed.

In this manner, any part of the opening pattern on the substrate can be drawn at least twice by different regular squares of the original plate. Since there is an extremely low possibility that there may be dust at both the two regular square patterns on the original plate, there is no possibility that any fault may occur on the opening pattern formed by two times of exposure process.

Further, in the explanation, exposure is conducted by use of different two regular squares prepared in one original plate, however, two original plates having an identical opening pattern as shown in FIG. 12D may be employed. These two original plates have completely identical basic shapes, and an opening pattern is drawn twice on a same substrate by use of the two original plates. In such an exposure method, there is an extremely low possibility that there may be dust at identical basic shapes of both the original plates. As a consequence, it can be said that there is no possibility that any fault may occur on the opening pattern.

As mentioned above, by use of different basic shapes of an original plate, or identical basic shapes of different original plates, two times of exposure process are carried out to an opening pattern, thereby any part of the opening pattern is drawn at least twice by use of different basic shapes of original plate. Accordingly, it is possible to effectively eliminate influence of dust on the original plate, and also it is possible to prevent a fault from occurring to the opening pattern exposure.

Figure 13:
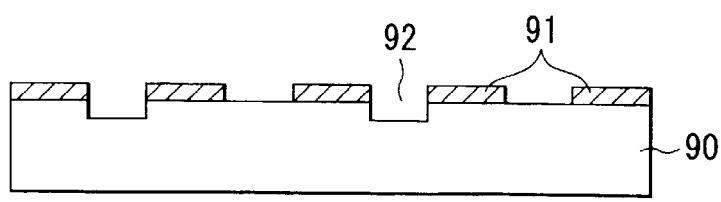
FIG. 13 is a cross sectional view for explaining a modified embodiment of the present invention, showing an example of a Rebenson type phase shift mask.

It must be noted that the present invention is not limited only to the embodiment and modifications thereof mentioned above. In the embodiment, an example of a half tone type phase shift mask has been explained, however, the present invention is not limited to this type only, but the present invention may be applied also to, for example, the production of Rebenson type phase shift masks as shown in FIG. 13. In the case of the Rebenson type ones, required are a first time of exposure for patterning a beam blocking pattern 91 on a transparent substrate 90, and a second time of exposure for engraving the substrate 90 to a predetermined depth by one opening pattern 92 of two opening patterns adjacent to the left and right sides of this beam blocking pattern 91 are required. In this way, the embodiment according to the present invention may be applied to the case where two times of exposure is required. Still further, the present invention may be applied also to the production of exposure masks which requires two times or more of exposure processes.

And the device to be used for exposure for forming a main pattern is not limited to an electronic beam exposure apparatus, but any device that can carry out high precision exposure may be employed, and may be appropriately modified in accordance with specifications of the pattern exposure. In the same manner, the device to be used for exposure for forming an opening pattern is not limited to a laser exposure apparatus or an i-ray stepper, but any device that can carry out high speed exposure may be employed, and may be appropriately modified in accordance with the specifications.

And further, the transparent substrate as a supporting substrate for exposure mask is not limited only to one made of quartz, but any substrate that has sufficient permeability ratio to the beam used for the exposure by using the mask may be also employed. Still further, the beam blocking film is not limited to Cr, but any material that has sufficient permeability ratio to exposed beam may be employed too. And the phase shift film is not limited to molybdenum silicide, and may be appropriately modified in accordance with the specifications. In this way, it may be understood by those skilled in the art that the present invention may be applied in other specific forms without departing from the spirit or essential characteristics thereof.

When exposing an opening pattern, by using an original plate where plural basic shapes with different dimensions are formed, the entire opening pattern area may be exposed by combination of basic shapes, thereby it is possible to expose the opening pattern area at high speed. As a result, it is possible to increase the throughput. Still further, when exposing an opening pattern, several times of exposure may be carried out by changing combinations of basic shapes, as a consequence, it is possible to eliminate any fault on the opening pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of producing an exposure mask by carrying out patterning with at least two times of exposure on a mask substrate, comprising:

performing a first time exposure of a first pattern and an alignment mark which is used as a reference for positioning at a second time exposure of a second pattern, the alignment mark being exposed onto a corrected position on the mask substrate with positional error by substrate deformation obtained in advance with a first exposure apparatus corrected; and performing a second time exposure of the second pattern, by detecting a position of the alignment mark with a positional error caused by a substrate deformation obtained in advance in a second exposure apparatus to be used corrected, so as to determine the position of the second pattern with respect to the first pattern according to the detected position of the alignment mark.

2. A method of producing an exposure mask according to claim 1, wherein in the first pattern exposure, a device pattern is exposed onto the main pattern formation area on the mask substrate and the alignment marks are exposed onto the outside of the main pattern formation area, while in the second pattern exposure, an opening pattern for exposing the entire formed device pattern is exposed.

3. A method of producing an exposure mask according to claim 2, wherein in the first pattern exposure, a phase shift film and a beam blocking film are formed onto a transparent substrate used as the mask substrate, and a first resist film is applied thereon, a device pattern together with the alignment marks is exposed by the first time of exposure, thereby a corresponding resist pattern is formed through development, and the light blocking film and the phase shift film are selectively etched with the formed resist pattern as a mask to form the device pattern, and in the second pattern exposure, a second resist film is applied onto the entire surface of the mask substrate, and to this second resist film, an opening pattern is exposed by the second time of exposure.

4. A method of producing an exposure mask according to claim 2, wherein in the first pattern exposure, a light blocking film is formed onto a transparent substrate used as the mask substrate, and a first resist film is applied thereon, an opening pattern together with the alignment marks is exposed by the first time of exposure, whereby a corresponding resist pattern is formed through development, and the light blocking film is selectively etched with the formed resist pattern as a mask to form the opening pattern, and in the second pattern exposure, a phase shift film is deposited, a second resist film is applied onto the entire surface of the mask substrate, a device pattern is exposed to this second resist film in the opening pattern by the second time of exposure, and the phase shift film is selectively etched with the formed resist pattern as a mask to form the device pattern.

5. A method of producing an exposure mask according to claim 2, wherein when exposing the opening pattern, one pattern original plate or more where plural basic shapes having different dimensions are formed is used, and the entire surface of the opening pattern is exposed by a combination of at least two basic shapes.

6. A method of producing an exposure mask according to claim 5, wherein when exposing the opening pattern, two times or more of exposure are carried out to all the areas to be exposed, and in each time of exposure, different basic shapes on a single original plate are selected, or different original plates are employed.

7. A method of producing an exposure mask by carrying out patterning with at least two times of exposure on a mask substrate, comprising:

performing, using a first exposure apparatus, a first time exposure of a first pattern and an alignment mark which is used as a reference for positioning at a second time exposure of a second pattern, the alignment mark being exposed onto a corrected position on the mask substrate with positional error by substrate deformation obtained in advance with the first exposure apparatus corrected; and performing, using a second exposure apparatus, a second time exposure of the second pattern, by detecting a position of the alignment mark with a positional error caused by a substrate deformation obtained in advance in a second exposure apparatus to be used corrected, so as to determine the position of the second pattern with respect to the first pattern according to the detected position of the alignment mark.

8. A method of producing an exposure mask according to claim 7, wherein in the first pattern exposure, a device pattern is exposed onto a main pattern formation area on the mask substrate and the alignment marks are exposed onto other area than the main pattern formation area, while in the second pattern exposure, an opening pattern for exposing the entire formed device pattern is exposed.

9. A method of producing an exposure mask according to claim 8, wherein in the first pattern exposure, a phase shift film and a light blocking film are formed onto a transparent substrate used as the mask substrate, and a first resist film is applied thereon, a device pattern together with the alignment marks is exposed by the first time of exposure, thereby a corresponding resist pattern is formed through development, and the light blocking film and the phase shift film are selectively etched with the formed resist pattern as a mask to the device pattern, and in the second pattern exposure, a second resist film is applied onto the entire surface of the mask substrate, and an opening pattern is exposed to this second resist film by the second time of exposure.

10. A method of producing an exposure mask according to claim 8, wherein in the first pattern exposure, a light blocking film is formed onto a transparent substrate used as the mask substrate, and a first resist film is applied thereon, an opening pattern together with the alignment marks is exposed by the first time of exposure, thereby a corresponding resist pattern is formed through development, and the light blocking film is selectively etched with the formed resist pattern as a mask to form the opening pattern, and in the second pattern exposure, a phase shift film is deposited, a second resist film is applied onto the entire surface of the mask substrate, a device pattern is exposed to this second resist film in the opening pattern by the second time of exposure, and the phase shift film is selectively etched with the formed resist pattern as a mask to form the device pattern.

11. A method of producing an exposure mask according to claim 8, wherein when exposing the opening pattern, one pattern original plate or more where plural basic shapes having different dimensions are formed is used, and the entire surface of the opening pattern is exposed by a combination of basic shapes.

12. A method of producing an exposure mask according to claim 11, wherein when exposing the opening pattern, two times or more of exposure are carried out to all the areas to be exposed, and in each time of exposure, different basic shapes on an identical original plate are selected, or different original plates are employed.

13. A method of producing an exposure mask according to claim 7, wherein when exposing the opening pattern, two times or more of exposure are carried out to all the areas to be exposed, and in each time of exposure, different basic shapes on an identical original plate are selected, or different original plates are employed.

14. A method of manufacturing a semiconductor device by using an exposure mask which is produced by carrying out patterning with at least two times of exposure on a mask substrate, comprising:

preparing the exposure mask produced by performing a first time exposure of a first pattern and an alignment mark which is used as a reference for positioning at a second time exposure of a second pattern, the alignment mark being exposed onto a corrected position on the mask substrate with positional error by substrate deformation obtained in advance with a first exposure apparatus corrected; performing a second time exposure of the second pattern, by detecting a position of the alignment mark with a positional error caused by a substrate deformation obtained in advance in a second exposure apparatus to be used corrected, so as to determine the position of the second pattern with respect to the first pattern according to the detected position of the alignment mark; and exposing a semiconductor wafer by using the prepared exposure mask.

* * * * *